US007767957B2

(12) United States Patent
Viehmann

(10) Patent No.: US 7,767,957 B2
(45) Date of Patent: Aug. 3, 2010

(54) ARRANGEMENT FOR MONITORING ELECTRIC DEVICES ON STRAY LIGHT ARCS

(75) Inventor: Matthias Viehmann, Sangerhausen (DE)

(73) Assignee: Fachhochschule Nordhausen, Nordhausen (DE)

( * ) Notice: Subject to any disclaimer, the term of this patent is extended or adjusted under 35 U.S.C. 154(b) by 772 days.

(21) Appl. No.: 10/571,181

(22) PCT Filed: Sep. 9, 2004

(86) PCT No.: PCT/EP2004/010449

§ 371 (c)(1), (2), (4) Date: Mar. 9, 2006

(87) PCT Pub. No.: WO2005/027160

PCT Pub. Date: Mar. 24, 2005

(65) Prior Publication Data

US 2007/0023618 A1 Feb. 1, 2007

(30) Foreign Application Priority Data

Sep. 9, 2003 (DE) ................................ 103 42 370

(51) Int. Cl.
*G01J 1/04* (2006.01)
*G02B 6/44* (2006.01)
*H02H 3/00* (2006.01)
*G01R 31/00* (2006.01)

(52) U.S. Cl. .................... 250/227.11; 385/101; 361/45; 324/96

(58) Field of Classification Search ............ 250/227.11, 250/227.14, 559.43, 208.4, 426; 361/45, 361/87; 324/117 R, 96, 11 R; 356/313, 328, 356/483; 362/19, 327, 551; 398/17, 20; 327/190; 385/12, 101, 106
See application file for complete search history.

(56) References Cited

U.S. PATENT DOCUMENTS 3,618,526 A * 11/1971 Baker ......................... 102/201

(Continued)

FOREIGN PATENT DOCUMENTS

DE 3534176 A1 7/1986

(Continued)

OTHER PUBLICATIONS

Patent Abstracts of Japan Publication No. 06222097A, published Aug. 12, 1994.

(Continued)

*Primary Examiner*—Georgia Y Epps
*Assistant Examiner*—Don Williams
(74) *Attorney, Agent, or Firm*—Kriegsman & Kriegsman

(57) ABSTRACT

The invention concerns an arrangement for monitoring electrical equipment for the emergence of accidental arcs. The object is to more reliably recognize the occurrence of an arc on lines, cables and/or contact sites or in devices than has been possible with previously known solutions.

Figure 1:
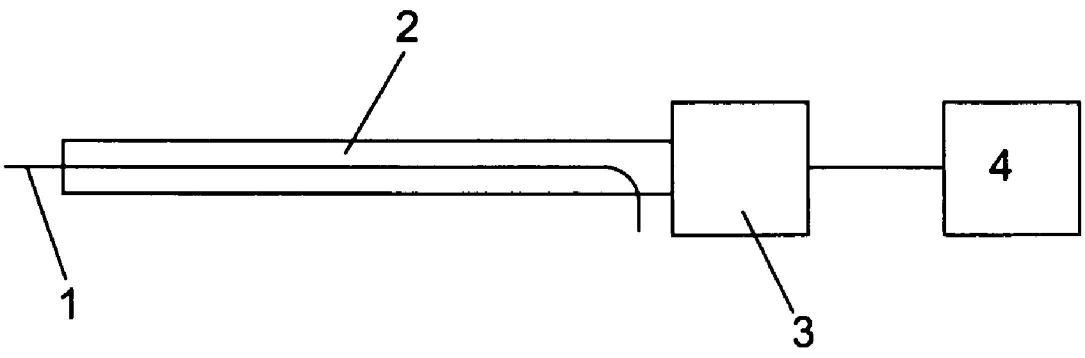

The proposed arrangement comprises at least one electrical conductor, which connects devices, subassemblies or circuit components of the piece of electrical equipment with one another, at least one light guide or optical fiber which guides the light arising in the formation of an arc to an optical/electrical transformer, as well as a monitoring and evaluating unit electrically connected with the transformer. The optical fiber envelops one or more wire cores of the above-mentioned electrical conductor and thus simultaneously forms the electrical insulation of a line or the shielding of a cable.

28 Claims, 2 Drawing Sheets

U.S. PATENT DOCUMENTS

| | | | | | |
|---|---|---|---|---|---|
| 4,067,052 | A * | 1/1978 | Neuhoff | 361/42 |
| 4,134,639 | A * | 1/1979 | Di Vita | 385/50 |
| 4,424,147 | A * | 1/1984 | Kurz et al. | 252/575 |
| 4,464,700 | A * | 8/1984 | Stenerhag et al. | 361/307 |
| 5,093,553 | A * | 3/1992 | Harvey et al. | 219/130.01 |
| 5,146,528 | A | 9/1992 | Gleim et al. | |
| 5,185,685 | A * | 2/1993 | Tennies et al. | 361/45 |
| 5,569,840 | A | 10/1996 | Thuries | |
| 7,162,161 | B2 * | 1/2007 | Wyatt et al. | 398/142 |
| 2005/0094270 | A1 * | 5/2005 | Ostromek et al. | 359/559 |

FOREIGN PATENT DOCUMENTS

| | | | |
|---|---|---|---|
| DE | 29513343 | U1 | 2/1997 |
| DE | 19935440 | A1 | 2/2001 |
| DE | 19948566 | A1 | 4/2001 |
| EP | 0359985 | A2 | 3/1990 |
| EP | 0575932 | A1 | 12/1993 |

OTHER PUBLICATIONS

Patent Abstracts of Japan Publication No. 2000276955A, published Oct. 6, 2000.

* cited by examiner

ARRANGEMENT FOR MONITORING ELECTRIC DEVICES ON STRAY LIGHT ARCS

The invention concerns an arrangement for monitoring electrical equipment for the occurrence of accidental arcs. It serves for the detection of an arc that sometimes is formed during the operation of a piece of electrical equipment, with the objective of being able to derive, from the detected signal, a warning signal or a control signal that is suitable for disconnecting an affected circuit.

Arcs may be generated in the operation of electrical equipment, in particular, on lines, cables and/or plug connections or contact sites, by means of which devices, subassemblies or circuit components are connected to one another. Arcs also frequently occur in switching processes. Following the circuit course, arcs may occur serially within a current circuit and/or also, so-to-speak, in parallel, between circuits disposed next to one another. Arc-overs and breakdowns between or on electrical conductors and metal housing parts are also possible. Reasons for the formation of arcs, for example, include sites of abrasion or buckling on the lines as well as pinchings or cable breaks. In addition, arcs can be formed by vibrations in the operation of equipment or by damage of insulation. Not lastly, an inadequate installation of the conductor may be the cause. Arcs cause interference in adjacent electrical devices and equipment, but may also be the cause of a disruption in the affected circuit components or of fires which lead to a great deal of damage or even to endangering humans.

In fact, the formation of arcs can be prevented by structural measures. However, in the final analysis, their occurrence cannot be completely excluded. Therefore, in sensitive fields, such as, for example, in vehicle manufacture, aircraft construction or shipbuilding, it is necessary to find solutions, by means of which the formation of an arc can be recognized in order to be able to find suitable measures for preventing further damage.

An apparatus is known from EP 0 575,932 A1 for recognizing accidental arcs, in which the magnetic field caused by an arc is recognized by means of a Hall-effect device and if an arc is detected, a switching device is operated for disconnecting the affected circuit. Corresponding to an advantageous enhancement of the described solution, in addition, an arc is recognized by detecting the light emitted from it. Thus, for monitoring several parallel busbars, it is proposed to wrap an optical fiber around these busbars in a loop and when an arc occurs, to guide the light that is picked up on the outside of this loop and thus has been subjected to a not inconsiderable attenuation, to an optical receiver. Of course, with the use of the optical fiber or light guide according to this solution, arcs can be recognized only selectively e.g., in the neighborhood of individual, possibly particularly endangered positions which are also supported optically.

JP 06 [1994]-222,097 A discloses a solution for recognizing arcs that operates exclusively on an optical basis. Here, it is proposed that a parallelly disposed optical fiber is provided along lines or cables to be monitored. Light is transmitted between an emitter that emits light and an optical receiver by means of the optical fiber. In the case of an arc, the optical fiber will melt as a consequence of the high temperature that prevails, so that the disconnection that is brought about of the connection between the light emitter and receiver can be evaluated at the latter. A disadvantage here is the fact that the optical fiber may not break down in certain cases when an arc occurs. This might happen, for example, when an arc arises on the side of the electrical conductor that is brought into contact with the optical fiber, if, for example, an arc is formed differently than assumed—not between two parallel conductors, but rather between one of the conductors and a housing that surrounds the conductor. In order to reliably exclude this possibility, a multiple number of optical fibers surrounding both electrical conductors must be provided, which would mean a considerable expense.

The solution presented in DE 295 13,343 U1, which is also based on the use of an optical fiber, manages without an emitter emitting light, unlike the previously presented solution. Here, a direct evaluation is made of the light coupled with the optical fiber in case of an arc. For this purpose, one or more optical fibers is coiled around a line or a cable to be monitored. In order to assure a spatially all-encompassing monitoring of the electrical conductor that is affected, preferably a large number of optical fibers are necessary, which are to be disposed in sufficiently close coils around the electrical conductor. Since the light of an arc is recorded radially from the outside in one or more optical fibers, care must also be taken that conventional optical fibers are created such that an input and output of light over their cladding surfaces is nearly excluded. The attenuation that has been present so far of the light that is recorded from the outside when an arc is formed can sometimes adversely affect the reliability of recognition of possible arcs or may require the formation of a very narrow-mesh network of optical fibers disposed around the electrical conductor. The same is true for the solution described in DE 3,534,176 A1, and similar observations can also be made for the solutions presented by JP 12[2000]-276,955 A or EP 359,985 A2. The last-named publication concerns an electrical cable, the shielding of which is taken up together with the electrical wire cores by an optical fiber guided in parallel for this purpose.

The object of the invention is to reliably recognize the occurrence of an arc in electrical equipment, i.e., on the lines, cables and/or contact sites thereof. In particular, it will be a comprehensive solution for monitoring the monitored components, and it will assure in a spatially encompassing manner that if an arc occurs, suitable measures can be derived from it as a result.

The object is solved by an arrangement with the features of the principal claim. Advantageous embodiments or enhancements are given by the subclaims.

The proposed arrangement for monitoring electrical equipment for the formation of accidental arcs is comprised of at least one electrical conductor formed as a single-wire or multi-wire line or cable, which connects devices, subassemblies or circuit components of electrical equipment with one another, of means which guide light that arises when an arc is formed to an optical/electrical transformer, as well as a monitoring and evaluating unit that is electrically connected with the transformer. For the means which guide the light emitted from any possible arc to the optical/electrical transformer, at least one light guide or optical fiber is involved. In a way that is essential to the invention, the optical fiber envelops one or more wire cores of the above-mentioned electrical conductor and thus simultaneously forms the electrical insulation of a line or the shielding of a cable. That is, the optical fiber is a direct component of a monitored electrical conductor and, in addition, simultaneously serves for its electrical insulation. Thus, a combination conductor will also be discussed in the following in connection with the invention. Several embodiments will be provided below that give possible materials suitable for this purpose, which preferably involve transparent plastics, which, on the one hand, provide good optical properties and, on the other hand, can be used as flexible electrical insultors.

In particular, if the entire electrical conductor is enveloped by the optical fiber, it is thus nearly completely surrounded volumetrically by the optical fiber and arcs are monitored not only in segments, so that the advantage results that the enveloping of the conductor with the optical fiber—and thus its electrical insulation—can be produced during manufacture in a way known in and of itself in an extrusion process. As has already been presented, the electrical conductor enveloped by the optical fiber involves a line or a cable for connecting components of a piece of electrical equipment which are monitored in the described way. Depending on the circumstances and the requirements each time, in the sense of the invention, for example, electrical equipment is understood to be a group of electrical devices, an individual electrical device or a special subassembly of a device connected by corresponding lines or cables enveloped with an optical fiber.

Corresponding to its basic structure, the arrangement reacts to an arc which is emitted by the electrical conductor itself enveloped by the optical fiber. The light of the arc, unlike what is known from the prior art, is not radially coupled from the outside of the fiber, but is directly coupled on the inside of the optical fiber. The arrangement can also be executed, however, as will be seen in one example of embodiment, in such a way that it reacts to an arc which arises at a contact site of the electrical conductor with other units of the electrical equipment, this site being formed as a clamp or plug connection. For this, the optical fiber enveloping the electrical conductor is inserted into the contact site. The light emitted by the arc in this case is coupled axially to the front surface of the optical fiber. In the sense of the comprehension of electrical equipment as explained further above, such an axial coupling over the front surface is also taken into consideration, if a cable shaped in the way according to the invention is guided into the inside of a monitored device and an arc arises anywhere in the device. If a smaller device (of small volume) is involved, such a configuration may be sufficient for monitoring the entire device. However, insofar as a larger device is involved, of course, additional electrical conductors, which are enveloped by an optical fiber guided to a transformer, can also be provided in the device itself.

Different possibilities are conceivable for the design of the monitoring and evaluating device, each time depending on the application purpose and the degree to which an arc endangers a piece of electrical equipment, or depending on the consequences expected due the emergence of such arcs. In the individual case, it may be sufficient to signal the formation of an arc by a suitable optical or acoustic warning signal. Preferably, however, the arrangement according to the invention provides means for disconnecting the current through the circuit components of the piece of electrical equipment affected by an arc, wherein the named means are actuated or activated by the monitoring and evaluating unit in case an arc is detected. For example, means for disconnecting an affected circuit may involve relays or semiconductor switches or power semiconductors.

In order to increase the reliability or stability, preferably for suppressing the effect of extraneous light and/or for increasing the breakdown strength, the invention also comprises an arrangement in which the optical fiber enveloping the electrical conductor is enveloped by an additional electrically insulating cladding that is not transparent to light. In order to also reduce possible optical losses, as may occur, for example, due to curvatures in the line, it is thus advantageous to form the additional outer cladding on its inner side facing the optical fiber in an optically reflecting manner or to mirror-coat it. This may be done by disposing a light-reflecting foil on its inner side. An additional measure for suppressing the effect of extraneous light consists of coupling the light into the optical/electrical transformer via a corresponding filter that blocks certain wavelengths of the light (daylight and/or room lighting) or is transparent only for wavelengths that are typical of arcs. The filter can be disposed on the transformer or may be an integral component thereof.

The electrical conductor enveloped by the optical fiber can be formed in different ways apart from the number of electrically conducting core wires. Thus, for example, for protection from electromagnetic interference, a twisted two-wire line can be employed. A shielded line can also be surrounded by a shielding formed as an optical fiber in accordance with the invention. If the electrical line involves a stranded wire, since such an electrical conductor has a comparatively uneven surface, it has proven advantageous to introduce a compensating, leveling layer that is preferably, but not necessarily, light-reflecting, onto this surface, in order to obtain an even surface, which is then enveloped with the optical fiber, whereby this can be done, for example, by a tube sheathing method, thus by covering the electrical conductor with a flexible tubing forming an appropriate layer. It is also conceivable to introduce a viscous or gel-like layer in general, not only with the use of a stranded wire for the electrical conductor, in order to achieve a self-healing effect or a self-extinguishing effect in the case when the insulation or the shielding is broken down by the arc. Finally, while maintaining the basic principle of the inventors, it is also possible to construct the combination conductor as an arrangement with several optical layers or coatings separated by intermediate layers.

Basically, a line formed according to the invention or the combination conductor involves a line with a length that can be cut according to its application, this line also being coupled to the optical/electrical transformer, if need be, only by its lining. It is likewise conceivable, however, that the combination conductor involves a prefabricated line, which preferably has already been connected to the transformer. In the first case named above, the transformer is advantageously configured relative to its construction in such a way that it can be coupled to the optical fiber serving for the monitoring as simply as possible by a user, thus, for example, a device manufacturer. The optical fiber which, following the basic concept according to the invention, simultaneously functions as an insulator or a shielding may consist of a polymer, for example. The following have proven to be particularly suitable materials: polymethyl methacrylate (PMMA) and its modifications (e.g., cross-linked and fluoridated), polymethylpentene (PMP), optionally in combination with its copolymers, or polycarbonate (PC). Polycarbonate is characterized, for example, by a high flexibility and a particularly good temperature stability. It is also shock-resistant and self-extinguishing in case an arc causes the formation of flames. Polymethylpentene also possesses a good flexibility and is likewise suitable for use at high temperatures. In addition, it is a very good electrical insulator. All of the above-named polymers are characterized by a good transparency, thus a high transmittance. In addition, silicone elastomers or fluoridated polymers are taken into consideration as materials for optical fibers.

The most varied embodiments are conceivable for the optical/electrical transformer. From the point of view of a simple and good coupling to the optical fiber, the transformer is shaped as a cap that can be attached to an axial end of the optical fiber or a disk that can be pushed open, corresponding to one embodiment provided by the invention, wherein the cap or disk is optionally penetrated after the electrical conductor is attached. An embodiment that can be screwed onto an axial end of the optical fiber is also conceivable, however, wherein a ferule can be optionally provided for it on the optical fiber. In the sense of the invention, of course, it is also conceivable, for example, if the length of the conductor to be monitored corresponds to that of the optical fiber, to connect both ends of the optical fiber to an optical/electrical transformer. This solution is not considered, of course, if the combination of electrical conductor and optical fiber can be trimmed with respect to length. As long as such a combination is already provided with a transformer or a ferule at an axial end of the optical fiber during manufacture, one can speak of a prefabricated line here also. In another advantageous possibility for connecting the optical fiber with the optical/electrical transformer, it is provided that the transformer is sealed into the optical fiber, preferably at an axial end of the optical fiber. With respect to previous progressive development in polymer electronics, it is thus conceivable that the transformer also consists of a polymer.

Corresponding to the different embodiments of lines and configurations of the equipment to be monitored that are possible with respect to the number of wire cores of the electrical conductor, embodiments of the arrangement according to the invention are also possible, in which several optical fibers are guided onto one optical/electrical transformer. In these cases, the optical/electrical transformer may optionally involve a CCD line, a CCD matrix or a CMOS array.

Insofar as the combination formed by the electrical conductor and the optical fiber involves a prefabricated line of fixed length, in which only one axial end of the optical fiber is provided for connecting with an optical/electrical transformer, while the other end (but not the end of the electrical conductor enveloped by the optical fiber) remains open after incorporation in the piece of equipment to be monitored, the free end is made reflective in accordance with an advantageous enhancement. In this way, it is assured that the light approximately in the vicinity of this end of the emerging arc does not exit the optical fiber, but rather is reliably received by the transformer and thus made available for evaluation. Optionally, a reflective coating can be provided in the case of a line that can be trimmed in length even after sealing the open end with a reflecting cap. The last-named variant opens up the possibility of integrating an optical emitter in such a cap, by means of which a self-test of the arrangement can be conducted by connecting or turning on the monitored piece of electrical equipment or can be controlled over time by the monitoring and evaluating unit. In evaluating a light pulse emitted by the optical emitter, an examination can be made of whether the optical fiber is interrupted or damaged.

Corresponding to another configuration of the invention which is practically relevant, in optical fibers with longer line lengths, such as are necessary in the monitoring of electrical connections in ships, light intensifiers are incorporated in line segments.

The invention will expressly also comprise those arrangements in which the optical fiber enveloping the electrical conductor serves for both coupling the light of a possible arc as well as also for transmitting any other useful signals within the monitored piece of electrical equipment. Under certain circumstances, measures are taken for separating or dividing a transmitted useful signal from the light of an arc, which are familiar to the person skilled in the art, i.e., optionally providing light shunts or filters or modulating the useful signal in a way that is suitable for it. Both the light-emitting component that is present when the optical fiber is utilized for useful signals, as well as the optical/electrical transformer can thus be structured in such a way that they are coupled to the wave guide by means of a slot/clamping technique for coupling and uncoupling light from the outside. Thus they are impressed into the wave guide by a claw-like structure with projecting optically active elements. Optionally, both the optical coupling with the optical fiber as well as the contacting of the electrical conductor are conducted with the use of the slot/clamping technique.

In the case that the optical fiber of the arrangement according to the invention is used also for the optical transmission of useful signals in addition to the detection of accidental arcs, the light signals brought about by accidental arcs and useful optical signals can be differentiated by means of reference curves filed in the monitoring and evaluating unit. In this case, reference curves for different types of accidental arcs are preferably filed in the corresponding unit.

The signals also can be transmitted between the optical/electrical transformer and the monitoring and evaluating unit, of course, by means of an electrical conductor enveloped by an optical fiber, wherein the optical fiber optionally also serves for transmission of useful signals, following the preceding considerations. However, it is likewise conceivable to provide the signal transmission between the transformer and the monitoring and evaluating unit by the use of the so-called "power line technique", in which the signal transmission is produced via power supply lines of the monitored piece of equipment.

The invention will be explained once more in more detail below on the basis of an embodiment example. In the appended drawings, the following are shown:

FIG. 1. A basic embodiment of the invention with a line that can be trimmed in length.

Figure 2:
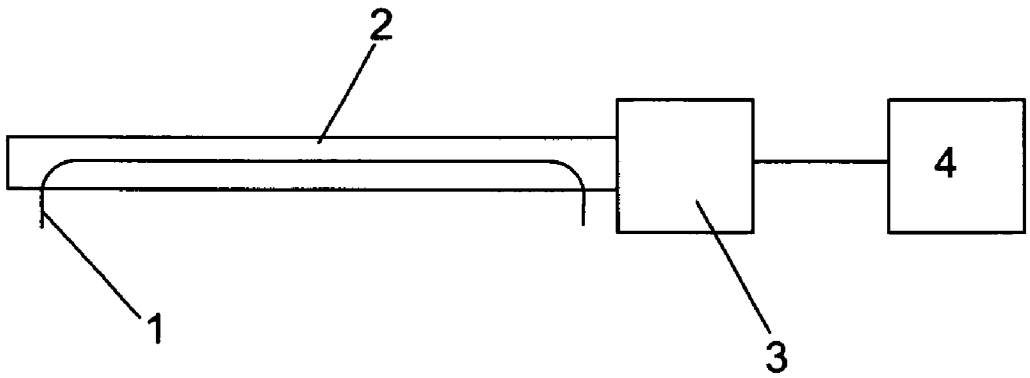

FIG. 2. The invention shown in FIG. 1 with the use of a prefabricated line of fixed length.

Figure 3:
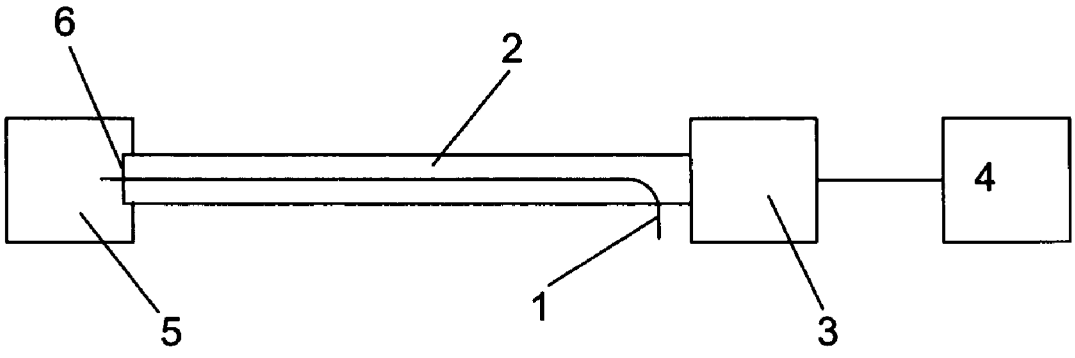

FIG. 3. An embodiment of the arrangement according to the invention for monitoring the inside of a plug-and-socket device.

Figure 4:
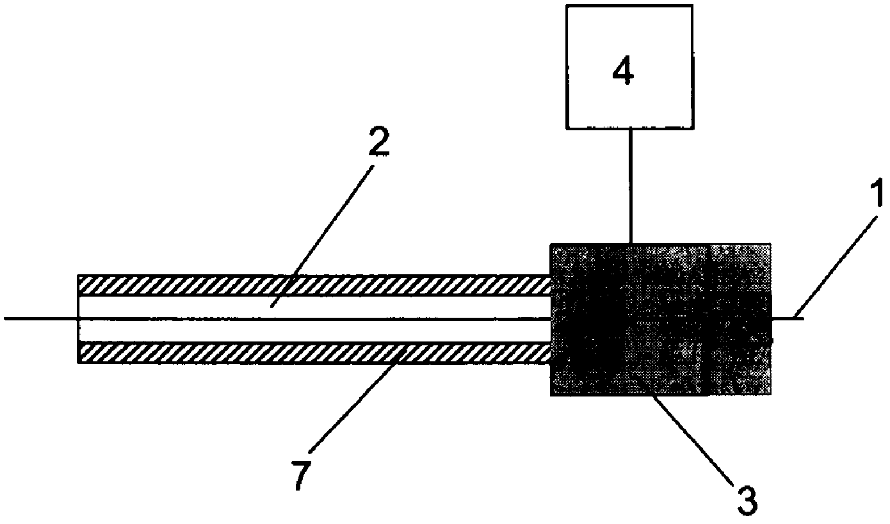

FIG. 4. An embodiment with an optical/electrical transformer that can be attached.

The arrangement according to the invention is rendered in a symbolic representation by FIG. 1. The arrangement comprises an optical fiber 2, an optical/electrical transformer 3 and a monitoring and evaluating unit 4 for evaluating the signals of the above-named transformer 3. The direct component of the arrangement, in addition, is an electrical conductor 1, which connects circuit components, subassemblies or devices of a piece of electrical equipment, which are not shown here, and, corresponding to the basic concept of the invention, is enveloped over nearly its entire length by optical fiber 2. The electrical conductor 1 thus forms virtually a non-optical core of optical fiber 2. In the example according to FIG. 1, this involves an electrical line which can be trimmed in its length and which is monitored for arcs by means of the other parts of the arrangement, and its insulation is formed by optical fiber 2. In the case that an arc occurs from electrical conductor 1, the light arising thereby is coupled into optical fiber 2 directly on the inside of optical fiber 2. The light is conducted by optical fiber 2 to the optical/electrical transformer 3, whose signals are processed by the monitoring and evaluating unit 4. Each time depending on the structure of the evaluating and monitoring unit 4, this unit can activate a warning signal in case an arc occurs, or a circuit module comprising a suitable switching element can be controlled, which disconnects the circuit segment affected by the arc. The elements and circuit modules necessary for suitable evaluation of the detector signal are known to the person skilled in the art and will not be the subject of detailed explanations here.

A transmission line circuit affected by an arc can be disconnected, for example, by means of a correspondingly controlled relay. As long as the optical/electrical transformer 3 has a corresponding surface, unlike the representation shown by FIG. 1, it is also possible that several optical fibers serving as shielding of electrical conductors can be guided onto this surface. In the case of complicated situations, the use of a CCD line or matrix for the optical/electrical transformer 3 is also conceivable.

FIG. 2 represents a slightly modified variant of the arrangement according to FIG. 1. Unlike in FIG. 1, the line here, which is formed by the electrical conductor 1 and the optical fiber 2 enveloping it, involves a prefabricated line with fixed length. In order to be able to clamp or to contact the electrical conductor 1 at the sites provided for this purpose, its ends are led out radially from the optical fiber 2 serving for monitoring. It can be viewed as particularly advantageous that such an electrical conductor 1 provided with an optical fiber 2, independent of whether it has a fixed or variable length, can be enveloped simultaneously with electrical insulation and the optical fiber 2 serving for its later monitoring in a single extrusion step during production. Depending on the application it may also be appropriate to provide a combination conductor formed in this way with an additional cladding 7 that is not transparent to light for reasons of stability or in order to reduce the effects of extraneous light. Still other complementary measures or special constructions of the optical/electrical transformer 3 may be necessary for further adaptation. Thus, it may be necessary or appropriate to couple the optical/electrical transformer 3 to the corresponding filter elements in order to suppress the effect of ambient light. Another measure affecting the line consists of the possible mirror-coating of an optionally free axial end of optical fiber 2. This may be of advantage with respect to a reliable evaluation of the light recorded from an arc in optical fiber 2. Finally, in the case of longer line lengths, for example, in shipbuilding, the intermediate connection of light intensifiers in optical fiber 2 may be necessary.

FIG. 3 shows that the line, which is constructed in the way described and comprises electrical conductor 1 and optical fiber 2, following the basic concept of the invention, can also be used for monitoring contact sites, such as, for example, the inside of a plug connection 5. For this purpose, the line, including optical fiber 2 enveloping it, is guided directly into the corresponding contact site to be monitored. In this case, light arising from a possible arc is coupled axially via front surface 6 of optical fiber 2 and introduced into optical/electrical transformer 3. The rest of the mode of action is the same as has already been described for FIG. 1. With respect to the fact that the invention is also intended for monitoring complex electrical or electronic equipment, the unit characterized by the reference number 5 in FIG. 3 may optionally also involve a complete device, preferably of small dimensions, in the housing of which the combination conductor according to the invention is inserted for the detection of accidental arcs that may occur and is connected to the device therein, for example, by means of a clamp connection or a similar type of connection.

In addition to the measures already presented in the explanation of FIG. 1 and FIG. 2 for adapting the arrangement to the respective type of application, the optical/electrical transformer 3 also can be structured in different ways. Corresponding to an advantageous embodiment presented in FIG. 4, the transformer 3 can be configured as a cap that can be attached onto optical fiber 2. Thus the electrical conductor 1 projects through cap-shaped transformer 3 in the example shown. For further reduction of the influence of ambient light and/or to increase shock resistance, the line comprising the electrical conductor 1 and the optical fiber 2 is enveloped by an additional insulating cladding 7 that is not transparent to light in this example.

The most varied fields of application are conceivable for the arrangement or the combination conductor according to the invention. In addition to monitoring stationary devices, in particular, applications are also considered for recognizing breaks in wire or implied breaks in wire of electrical control and supply lines that are in motion—for example, in automobile manufacture or in robotics techniques, Their use is also conceivable in connection with the use of fuel cell technology in hybrid vehicles. Likewise the application in photovoltaic installations, in which an arc that may occur due to the current source characteristic thereof is meaningful, if need be, until it becomes dark, or would burn until the onset of night.

LIST OF REFERENCE NUMBERS USED

1 Electrical conductor
2 Optical fiber
3 (Optical/electrical) transformer
4 Monitoring and evaluating unit
5 Clamp or plug connection, optionally device
6 Front surface of the optical fiber
7 Insulating cladding

The invention claimed is:

1. An arrangement for monitoring electrical equipment for the formation of accidental arcs comprised of at least one electrical conductor formed as a single-wire or multi-wire line or cable, which connects devices, subassemblies or circuit components of the piece of electrical equipment to one another, means which guide the light that emerges when an arc is formed from the site of its formation to an optical/electrical transformer and a monitoring and evaluating unit electrically connected to the transformer for evaluating the signals of transformer, is hereby characterized in that the means which guide the light that emerges when an arc is formed to an optical/electrical transformer involve at least one optical fiber, which envelops one or more wire cores of the electrical conductor and thus simultaneously forms the electrical insulation of a line or the shielding of a cable.

2. The arrangement according to claim 1, further characterized in that the arrangement responds to an arc, which originates from the electrical conductor, whereby the light originating from the arc is coupled to the optical fiber directly on the inside of the optical fiber.

3. The arrangement according to claim 1, further characterized in that the arrangement responds to an arc which arises at a contact site of electrical conductor with other units of the piece of electrical equipment, this site being formed as a clamp or plug connection, whereby the optical fiber is guided into the contact site and the light originating from the arc is coupled axially to a front surface of the optical fiber.

4. The arrangement according to claim 1, further characterized in that it comprises means for disconnecting the current through the circuit components of the piece of electrical equipment that are affected by the arc, and these means are actuated or activated by the monitoring and evaluating unit based on the detection of the arc.

5. The arrangement according to claim 1, further characterized in that the optical fiber enveloping the one or more wire cores of the electrical conductor is enveloped by an additional electrically insulating cladding that is not transparent to light.

6. The arrangement according to claim 5, further characterized in that the inner surface of the additional outer cladding is structured in an optically reflecting manner, wherein a light-reflecting foil is preferably disposed on its inner side for this purpose.

7. The arrangement according to claim 1 with an electrical conductor that is uneven on its outer surface, further characterized in that the electrical conductor is provided with a compensating layer that is preferably light-reflecting and is arranged between it and the optical fiber in order to obtain an even surface.

8. The arrangement according to claim 1, further characterized in that the electrical conductor that is structured as a wire or a cable is enveloped by several optical fibers separated by intermediate layers.

9. The arrangement according to claim 1, further characterized in that the combination conductor formed by the enveloping of the electrical conductor with the optical fiber is formed as a line that can be trimmed in its length.

10. The arrangement according to claim 1, further characterized in that the optical fiber functioning simultaneously as insulation or shielding consists of a polymer.

11. The arrangement according to claim 10, further characterized in that the optical fiber consists of polymethyl methacrylate.

12. The arrangement according to claim 10, further characterized in that the optical fiber consists of polymethylpentene.

13. The arrangement according to claim 10, further characterized in that the optical fiber consists of polycarbonate.

14. The arrangement according to claim 10, further characterized in that the optical/electrical transformer consists of a polymer.

15. The arrangement according to claim 1, further characterized in that filters for suppressing the effect of extraneous light are disposed on or in the optical/electrical transformer.

16. The arrangement according to claim 1, further characterized in that the optical/electrical transformer is constructed in the form of a cap that can be attached to an axial end of the optical fiber or as a disk that can be pushed open, whereupon the electrical conductor projects through the cap or the disk.

17. The arrangement according to claim 1, further characterized in that the optical/electrical transformer can be screwed onto an axial end of the optical fiber.

18. The arrangement according to claim 1, further characterized in that the optical/electrical transformer is sealed in the optical fiber.

19. The arrangement according to claim 1, further characterized in that the optical fibers of several electrical conductors are guided onto an optical/electrical transformer.

20. The arrangement according to claim 1, further characterized in that the optical/electrical transformer is formed as a CCD line, a CCD matrix or a CMOS array.

21. The arrangement according to claim 1, further characterized in that an axial end of an optical fiber that is not sealed off by an optical/electrical transformer is mirror-coated or is provided with a reflecting cap.

22. The arrangement according to claim 21, further characterized in that an optical emitter is disposed in the reflecting cap for conducting a self-test of the arrangement, wherein the cap is formed as a semi-transparent mirror, which is transparent to light emitted from the optical transmitter disposed in the cap.

23. The arrangement according to claim 1, further characterized in that light intensifiers are disposed in segments in optical fibers with long line lengths.

24. The arrangement according to claim 1, further characterized in that the optical fiber enveloping the electrical conductor serves both for the coupling of the light of a possible arc as well as for the transmission of other useful signals within the monitored piece of electrical equipment.

25. The arrangement according to claim 24, further characterized in that the light signals caused by accidental arcs and useful optical signals are differentiated with the help of reference curves filed in the monitoring and evaluating unit for different types of accidental arcs.

26. The arrangement according to claim 1, further characterized in that the optical/electrical transformer and light-emitting components present in the case of using optical fiber for the transmission of useful signals are coupled by means of a slot/clamping technique for coupling and uncoupling light from the outside to the wave guide, wherein they are impressed into the wave guide by a claw-like formation with projecting optically active elements.

27. The arrangement according to claim 1, further characterized in that information is exchanged between optical/electrical transformer and monitoring and evaluating unit via an electrical conductor enveloped by an optical fiber.

28. The arrangement according to claim 27, further characterized in that information is exchanged between optical/electrical transformer and monitoring and evaluating unit via a power line serving simultaneously for the power supply of the monitored piece of electrical equipment.

* * * * *